(12) United States Patent
Wagoner et al.

(10) Patent No.: US 6,618,235 B1
(45) Date of Patent: Sep. 9, 2003

(54) SNUBBER CIRCUIT

(75) Inventors: Robert Gregory Wagoner, Roanoke, VA (US); Fred Henry Boettner, Roanoke, VA (US); William Duggan Brackman, Jr., Salem, VA (US); James Michael Nowak, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/063,192

(22) Filed: Mar. 28, 2002

(51) Int. Cl.[7] .................... H01C 7/12; H02H 1/00; H02H 1/04; H02H 3/22; H02H 9/06
(52) U.S. Cl. ..................... 361/118; 361/119
(58) Field of Search .................... 361/118, 111, 361/119; 363/50; 324/519, 522

(56) References Cited

U.S. PATENT DOCUMENTS

| | | | | |
|---|---|---|---|---|
| 4,502,085 A | * | 2/1985 | Morrison et al. | 361/56 |
| 4,554,500 A | * | 11/1985 | Sokira | 320/31 |
| 4,709,318 A | * | 11/1987 | Gephart et al. | 363/37 |
| 5,115,415 A | * | 5/1992 | Mumby et al. | 367/85 |
| 6,043,636 A | | 3/2000 | Gaudreau et al. | 323/282 |

* cited by examiner

*Primary Examiner*—Brian Sircus
*Assistant Examiner*—F. Ritz
(74) *Attorney, Agent, or Firm*—Cantor Colburn LLP

(57) ABSTRACT

A voltage transient suppression circuit for power electronic circuits comprising: a snubber circuit having a resistor and a first and second capacitive element connected in series with a switching power semiconductor; and a sensing logic device connected in parallel with the snubber circuit; the logic circuit being configured to receive voltage signals indicative of said first and second capacitive elements.

13 Claims, 3 Drawing Sheets

| VBRG>Vbth | VC1>Vcth | VC2>Vcth | SHORT |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |

SNUBBER CIRCUIT

BACKGROUND OF THE INVENTION

Switching-induced transient overvoltages are a common problem in high-speed, high power switching circuits, such as switching power converters and pulse modulators. Rapid current or voltage changes during commutation generate transient voltages because of the energy stored in circuit inductances and capacitances. In modern high-power switching circuits where current and voltage slew rates can reach 1 kA/ $\mu$s and 10 kV/ $\mu$s, transient voltage spikes can be quite severe. A number of voltage transient suppression circuits and devices have been developed in an attempt to solve this problem.

It is known to use a capacitive "snubber" as a voltage transient suppression circuit. A "snubber circuit" is shown in FIG. 1 generally at 10 (comprising a resistor 12 and capacitor 14 wired in series) in parallel with a switching power semiconductor 16. The resistor 12 and the capacitor 14 together form the snubber circuit 10, which is used in many different applications to limit the voltage overshoot and the rate of change in the voltage when a transient occurs in the system. A sudden rise in voltage across a switching power semiconductor 16 opening will be tempered by the charging action of capacitor 14 (the capacitor 14 opposing the increase in voltage by drawing current). During ON/OFF transition, the capacitor 14 is being charged by absorbing the energy stored in circuit inductance 17. The resistor 12 limits the amount of current that the capacitor 14 will discharge through the switching power semiconductor 16 when it closes again. The capacitor 14 is discharged during the ON state of the switching power semiconductor 16. Stored energy in capacitor 14 dissipates during the next ON period in resistor 12 and in the switching power semiconductor 16. Although the operation of each of the various snubbers differs slightly from the others, the method employed by all of the snubbers to suppress transient voltage is similar.

These snubber circuits, while generally able to limit voltage transients to a desirable level, have several disadvantages. For example, one disadvantage of this snubber circuit is that, due to the typical nature of its function, the resistor is sized such that it can withstand the power applied when the capacitor is working properly, but the resistor would have significantly more than its rated power applied to it if the capacitor fails or is shorted. In a typical circuit, when the capacitor shorts, the resistor power dissipation can be 100 times higher than its rating. Consequently, if the capacitor fails, the resistor will fail catastrophically shortly afterward. It is usually undesirable to select the resistor power rating to continuously withstand shorted capacitor conditions due to cost and mechanical constraints. Also, in many applications, a mechanism to detect capacitor failure and remove power cannot act quickly enough to protect the resistor. Attempts to implement a faster detection circuit often result in false triggers due to noise, which adversely impact the equipments reliability. Thus, there is a desire to eliminate the possibility of catastrophic resistor failure should the capacitor fail in a snubber circuit, while still providing a reliable, cost effective, and mechanically practical power circuit design.

SUMMARY OF THE INVENTION

The above discussed and other drawbacks and deficiencies are overcome or alleviated by a voltage transient suppression circuit for power electronic circuits comprising: a snubber circuit having a resistor and a first and second capacitive element connected in series with a resistive circuit element; and a sensing logic device connected in parallel with the snubber circuit. The logic circuit is configured to receive voltage signals indicative of said first and second capacitive elements of the snubber circuit, and said logic circuit utilizes said voltage signals to determine if a component failure has occurred.

BRIEF DESCRIPTION OF THE DRAWINGS

Referring now to the drawings wherein like elements are numbered alike in the several Figures.

DETAILED DESCRIPTION

Figure 1:
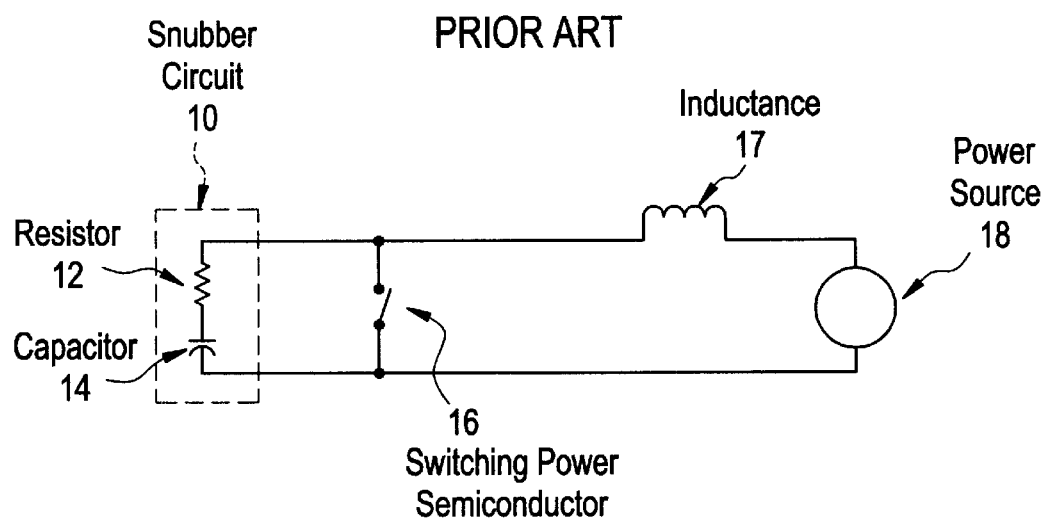
FIG. 1 is a schematic diagram of a conventional snubber circuit connected to a voltage device.
Figure 2:
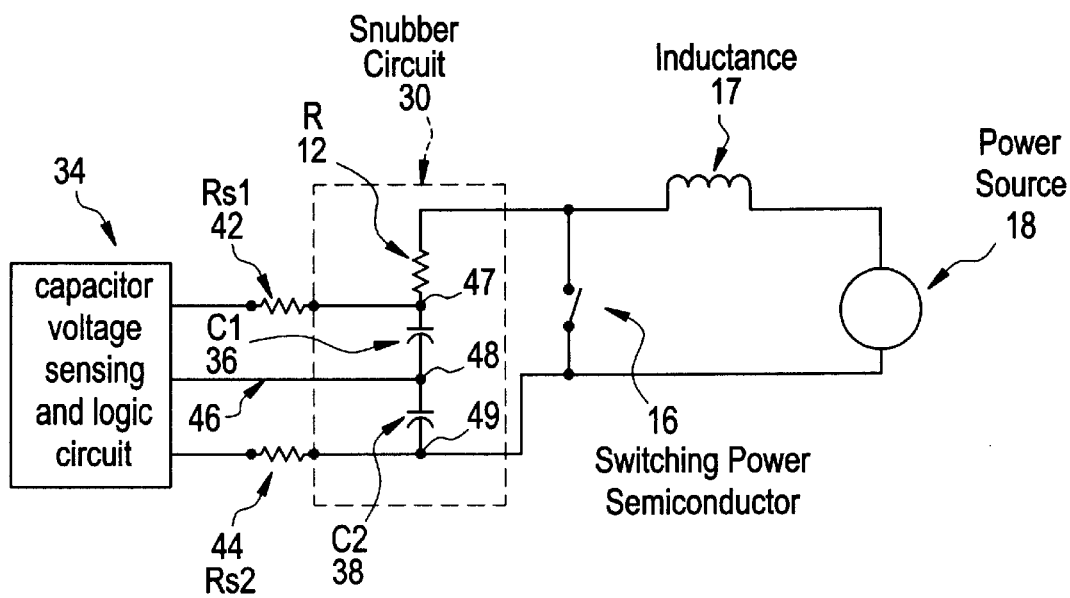
FIG. 2 is a schematic diagram of one embodiment of a snubber circuit connected to the voltage device and a sensing logic device.

Referring to FIG. 2, switching power semiconductor 16 is connected to one embodiment of a snubber circuit shown generally at 30. Snubber circuit 30 in turn is connected in parallel to a capacitor voltage sensing and logic circuit 34. The resistor 12 (R) and the two capacitors 36, 38 (C1 & C2, respectively) together form a snubber circuit that limits catastrophic failure of the resistor common with the present technology.

Logic circuit 34 includes a resistor 42 (Rs1) connected to node 47, the common terminal of capacitor 36 (C1) and resistor 12 (R). A resistor 44 (Rs2) is connected to node 49, the common terminal of capacitor 38 (C2) and switching power semiconductor 16. Resistors Rs1, Rs2, and a wire 46 to node 48 connect the capacitor voltage sensing logic circuit 34 in parallel with the capacitors C1 and C2 of the snubber circuit 30. Logic circuit 34 connection at node 48 provides a sensing voltage point for sensing voltages of capacitors C1 and C2. Since sensing voltage is always done between two points, the capacitor voltage on C1 is sensed between node 47 and node 48. The capacitor voltage on C2 is sensed between node 48 and node 49.

Rs1, Rs2, and wire 46 to node 48 also serve to balance the voltage across each of the capacitor elements C1 and C2. The wire to node 48 conducts current necessary to balance capacitor leakage currents by effectively putting resistor Rs1 in parallel with capacitor C1 and resistor Rs2 in parallel with capacitor C2. Leakage may be modeled as a resistor in parallel with a perfect capacitor. When the resistance provided through Rs1 and Rs2 is much lower than the equivalent leakage resistance of the capacitors, the voltage remains balanced. Selecting Rs1 and Rs2 to carry more current than an expected leakage current in C1 and C2, respectively, does this.

Still referring to FIG. 2, capacitor 36 and 38 preferably is selected to individually withstand the full voltage of switching power semiconductor 16. Then, if either capacitor 36 or 38 fails, the other capacitor continues to block the voltage, and the resistor power dissipation of resistor 12 is about twice its normal value. The resistor 12 can be selected to survive this power continuously while logic circuit 34 annunciates the failure, allowing the operation of circuit 30 to continue until it is convenient to replace the failed capacitor. Alternatively, resistor 12 can be selected to survive this power transiently while logic circuit 34 shuts down the operation of circuit 30. The shut down time would be coordinated with the transient power capability of resistor 12. By increasing the transient power capability of resistor 12, a slower logic circuit 34 can be used, avoiding a false trigger from noise common with faster logic circuits of the present technology previously mentioned. In either case, the backup capacitor in circuit 30 eliminates the possibility of resistor 12 failing catastrophically, thus eliminating this concern of the present technology.

Resistors 42 and 44 (Rs1 and Rs2) serve two purposes. As discussed above, one is to balance the voltage across C1 and C2, by sizing resistors Rs1 and Rs2 to carry more current than the expected leakage current in C1 and C2. The second purpose for Rs1 and Rs2 is to sense the voltage across C1 and C2, respectively. This capacitor voltage sensing can be used to determine the condition of each of these capacitors, ultimately to determine when one of the capacitors C1, C2 fails.

Figure 3:
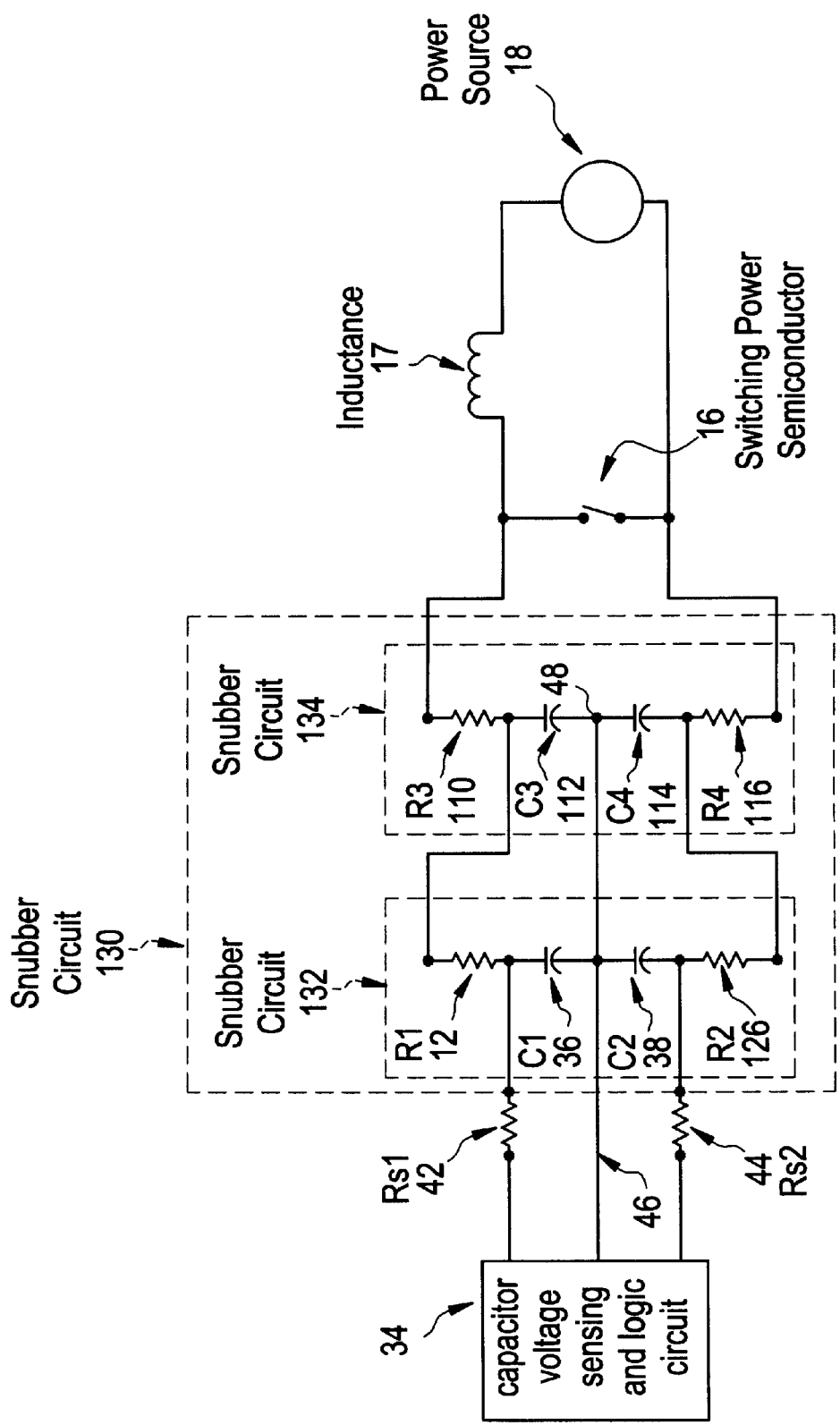
FIG. 3 is a schematic diagram of another embodiment of a snubber circuit connected to the voltage device and sensing logic circuit of FIG. 2.

Referring to FIG. 3, an alternative embodiment of a snubber circuit is shown generally at 130. Snubber circuit 130 is connected to switching power semiconductor 16 and connected to logic circuit 34 in parallel via resistor 42 (Rs1) and resistor 44 (Rs2). A first snubber circuit 132 joined in parallel with a second snubber circuit 134 forms snubber circuit 130. First snubber circuit 132 resembles snubber circuit 30 shown in FIG. 2 with the addition of a resistor 126 (R2) connected to the negative terminal of capacitor C2. Second snubber circuit 134 is generally duplicative of circuit 132 and the two circuits are joined in parallel fashion. Snubber circuit 130 includes a resistor 110 (R3) connected at one end to the positive terminal of switching power semiconductor 16. Another end of R3 connects with a positive terminal of capacitor 112 (C3). The negative terminal of C3 connects to node 48. A positive terminal of capacitor 114 (C4) connects with node 48. A negative terminal of capacitor C4 connects to a resistor 116 (R4) that in turn is electrically connected with the negative terminal of switching power semiconductor 16. Snubber circuit 130 further includes a resistor R1 connected at one end to the positive terminal of capacitor C3 and another end electrically connected with a positive terminal of a capacitor C1. A negative terminal of capacitor C1 is electrically connected with node 48 along with a positive terminal of a capacitor C2. A negative terminal of capacitor C2 is electrically connected with a resistor R2 that in turn is electrically connected with the negative terminal of capacitor C4. The negative terminal of capacitor C2 is also connected with a resistor Rs2 that is connected to logic circuit 34 to sense the voltage across capacitors C2 and C4. The positive terminal of capacitor C1 is also electrically connected with a resistor Rs1 which is connected to logic circuit 34 to sense the voltage across capacitors C1 and C3. Node 48 is also in operable communication with logic circuit 34 via wire 46 to conduct current necessary to balance leakage currents by effectively putting resistor Rs1 in parallel with capacitors C1 and C3, and resistor Rs2 in parallel with capacitors C2 and C4. When the resistance provided through Rs1 and Rs2 is much lower than the equivalent leakage resistance of the capacitors, the voltage remains balanced. As indicated above, voltage is measured between two points.

Still referring to FIG. 3, capacitors C1, C2, C3 and C4 are preferably selected to individually withstand the full voltage of switching power semiconductor 16. Then, the above described configuration will still have the advantage that, if any capacitor fails, the other capacitors continue to block the voltage. As before, the resistors R1, R2, R3 and R4 can be selected to survive this power continuously, and the logic circuit 34 would annunciate the failure, allowing the operation of circuit 130 to continue until it is convenient to replace the failed capacitor. Alternatively, resistor R1, R2, R3 and R4 can be selected to survive this power transiently and the logic circuit 34 would shut down the operation of circuit 130. The shut down time would be coordinated with the transient power capability of the resistors R1, R2, R3 and R4. By increasing the transient power capability of these resistors, a slower logic circuit 34 can be used, avoiding a false trigger from noise common with faster logic circuits of the present technology previously mentioned. In either case, the backup capacitors in circuit 130 eliminates the possibility of resistor R1, R2, R3 or R4 failing catastrophically, thus eliminating this concern of the present technology. Resistors Rs1 and Rs2 serve the same two purposes as before; one is to balance the voltage across C1, C2, C3 & C4, and the second purpose for Rs1 and Rs2 is to sense the voltage across C1, C2, C3 & C4. The capacitor voltage sensing and logic circuit 34 works the same as before, and performs the same functions of detecting a failed capacitor while reducing a false trigger caused by noise.

Figures 4, 5:
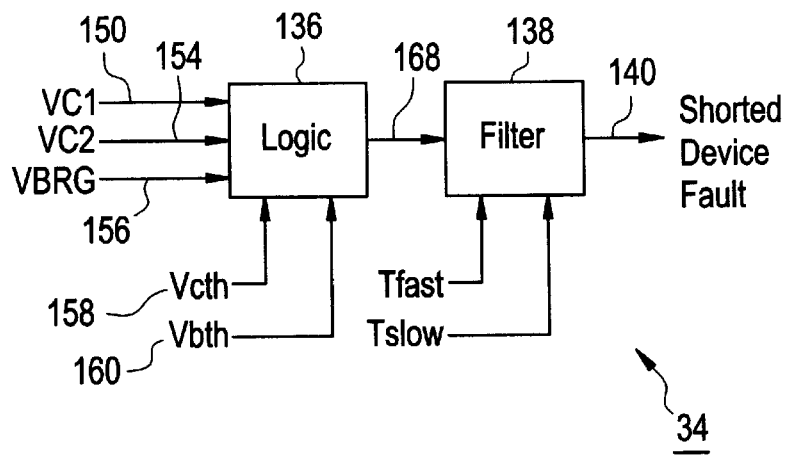
FIG. 4 is a block diagram illustrating a sensing algorithm performed by the sensing logic circuit of FIGS. 2 and 3.
FIG. 5 is a table illustrating voltage sensing logic of the sensing algorithm in FIG. 4.

Referring to FIG. 4, a block diagram represents one embodiment of a capacitor voltage sensing circuit 34 for performing an algorithm associated with logic circuit 34. Logic circuit 34 includes a logic block 136 and a filter block 138. Logic block 136 receives a first signal input 150 (VC1) indicative of the voltage across one capacitive element (not shown) and a second signal input 154 (VC2) indicative of the voltage across second capacitive element (not shown). It should be noted that first capacitive element represents the single capacitor C1 in FIG. 2 or the capacitors C1 and C3 effectively in parallel of FIG. 3 and second capacitive element represents the single capacitor C2 in FIG. 2 or the capacitors C2 and C4 effectively in parallel of FIG. 3. Logic block 136 also receives a signal input 156 (VBRG) indicative of the voltage across switching power semiconductor 16. Logic block 136 further obtains a voltage setting 158 (Vcth) and a threshold voltage setting 160 (Vbth). Threshold voltage setting 158 (Vcth) is the threshold voltage for the first and second capacitive elements. Threshold voltage setting 160 (Vbth) is the threshold voltage for the switching power semiconductor 16. Threshold voltage settings 158 (Vcth) and 160 (Vbth) may be selected for a particular application and input into memory (not shown) to be obtained and used by logic block 136. Logic block 136 processes signals VC1, VC2 and VBRG along with threshold voltage settings Vbth and Vcth to generate a logic output signal 168 indicating whether either or both of first and second capacitive elements have failed or shorted. Filter block 138 filters the logic output signal 168 to avoid false indications from noise. Filter block 138 generates a signal 140 to indicate a failed capacitor in snubber circuit 30, 130. External logic can be used to annunciate the condition and/or to turn off power to the circuit 30, 130.

The capacitor voltage sensing and logic circuit 34 may be a circuit card that monitors the voltage across each capacitive element, and if one of the capacitive element voltages is low when it should be high, circuit 34 generates a signal 140 that indicates that one of the capacitive elements has failed. Signal 140 may be used to remove the power from snubber circuit 30, 130 and may be used to indicate that one of the capacitive elements needs to be repaired or replaced.

Inputs to this circuit 34 have a relatively low impedance, compared to Rs1 and Rs2, such that the current through Rs1 and Rs2 is converted to a voltage signal on the circuit card. This keeps the voltage drop across the resistors on this circuit card low, and proportional to the voltage across the capacitor.

Referring to FIG. 5, a truth table for the logic block 136 exemplified in FIG. 4 is illustrated generally at 200. Column 202 indicates when the magnitude of the voltage across switching power semiconductor 16 (VBRG) is above or below a threshold voltage setting 160 (Vbth). When VBRG is greater than threshold Vbth, a "1" is indicated. When VBRG is less than threshold Vbth, a "0" is indicated. Column 204 indicates when the magnitude of the voltage across a first capacitive element (VC1) is above or below a threshold voltage setting 158 (Vcth). When VC1 is less than the threshold Vcth, a "0" is indicated. When VC1 is greater than threshold Vcth, a "1" is indicated. Column 206 indicates when a voltage across a second capacitive element (VC2) is above or below a threshold voltage setting 158 (Vcth). When VC2 is less than the threshold Vcth, a "0" is indicated. When VC2 is above the threshold Vcth, a "1" is indicated. Column 208 is indicative of the logic output signal 168 after processing by logic circuit 136. A "0" is indicative of a non-shorted state, while a "1" is indicative of a shorted state in one or both capacitors.

As discussed above, FIG. 5 illustrates that a voltage is expected across both capacitive elements when a voltage across the voltage source (VBRG) is present. When VBRG is greater than threshold setting (Vbth) and the voltage across both capacitive elements VC1 and VC2 are above the threshold setting (Vcth), a "no short" state is indicated with a "0" in column 208. This is illustrated in row 210. When VBRG is greater than threshold setting (Vbth) and the voltage across either capacitive element VC1 or VC2 is below the threshold setting (Vcth), a "short" state is indicated with a "1" in column 208. A shorted first capacitive element is illustrated in row 212 and a shorted second capacitive element is illustrated in row 214. When VBRG is greater than threshold setting (Vbth) and the voltages across both the capacitive elements are below the threshold setting (Vcth), then a "short" state is indicated with a "1" in column 208. This is illustrated in row 216. When VBRG is less than threshold setting (Vbth), the shorted state of the capacitors cannot be determined reliably. In this case a "no short" state is assumed with a "0" in column 208, regardless of the magnitude of the capacitive element voltages VC1 and VC2. This is illustrated in rows 220, 221, 222 and 223.

The output signal 168 generated by logic block 136 is received by filter block 138. Filter block 138 provides robustness and noise immunity for the algorithm. Filter block 138 generates signal 140 indicating a "shorted" state if a shorted condition is observed continuously over a predetermined sample period, preferably a long sample period. One embodiment depicted in FIG. 4 to provide a suitable sample period includes filter block having an accumulator (not shown) to sample the logic output signal 168 at a fast rate, (Tfast). Any logic output signal 168 sample indicating no short would latch a "not shorted" state or "0" state on the accumulator. The accumulator output is sampled at a slow rate (Tslow). The accumulator is reset immediately after it's output is sampled, and the reset forces a "shorted" state or "1" on the accumulator. Under normal operating conditions (no shorted capacitors), the logic output signal 168 would indicate a "not shorted" state for at least one Tfast sample before the next occurrence of the Tslow sample of the accumulator. If this occurs, a "not shorted" state will be latched into the accumulator and the Tslow sample will detect a "not shorted" state. If this does not occur, the Tslow sample will detect a "shorted" state.

In many instances, the switching power semiconductor 16 used with snubber circuit 30, 130 may be a silicon controlled rectifier (SCR). If this is the case, the aforementioned sensing logic can also be used to provide information that can be used to determine the condition of the power semiconductor. The simple logic to do this is as follows. When a voltage is expected on both capacitive elements, and the voltage is low on one capacitive element, then that capacitive element is bad. At a time when voltage is expected on both capacitive elements, and the voltage is low on both capacitive elements, then it is most likely that the power semiconductor (e.g., SCR) is bad or less likely that both capacitive elements are bad. Lastly, when a voltage is expected, and the voltage is present on both capacitive elements, then everything is functioning.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A voltage transient suppression circuit for power electronic circuits comprising:
   a snubber circuit having a resistor and a first and second capacitive element connected in series, said snubber circuit connected in parallel with a switching power semiconductor; and
   a sensing logic device connected in parallel with said snubber circuit; said logic circuit configured to receive voltage signals indicative of said first and second capacitive elements.

2. The voltage transient suppression circuit of claim 1 wherein said snubber circuit comprises:
   one terminal of said resistor in operable communication with a first terminal of said switching power semiconductor;
   a first capacitor having a first terminal and a second terminal, the first terminal in operable communication with another terminal of said resistor;
   a second capacitor having a first terminal and a second terminal, said first terminal of second capacitor in operable communication with said second terminal of first capacitor, said second terminal of second capacitor in operable communication with a second terminal of said switching power semiconductor; and
   wherein said sensing logic device is in electrical communication with said first and second capacitors, said logic device configured to detect a failed capacitor of said first and second capacitors and generate a signal indicative of said failed capacitor.

3. The voltage transient suppression circuit of claim 1 wherein said snubber circuit comprises:
   a first terminal of a first resistor in operable communication with a first terminal of said switching power semiconductor;
   a first capacitor having a first terminal and a second terminal, the first terminal in operable communication with another terminal of said resistor;
   a second capacitor having a first terminal and a second terminal, said first terminal of second capacitor in operable communication with said second terminal of first capacitor;

a first terminal of a second resistor in operable communication with said second terminal of said second capacitor and a second terminal of said second resistor in operable communication a second terminal of said switching power semiconductor;

a first terminal of a third resistor in operable communication with said first terminal of said first capacitor;

a third capacitor having a first terminal and a second terminal, said first terminal of said third capacitor in operable communication with a second terminal of said third resistor;

a fourth capacitor having a first terminal and a second terminal, said first terminal of said fourth capacitor in operable communication with said second terminal of said third and first capacitors;

a fourth resistor intermediate said second terminal of said fourth and second capacitors; and wherein said sensing logic device is configured to detect a failed capacitor of said first, second, third and fourth capacitors and generate a signal indicative of said failed capacitor.

4. The voltage transient suppression circuit of claim 2 wherein said signal causes electrical power to said snubber circuit to shut off.

5. The voltage transient suppression circuit of claim 3 wherein said signal causes electrical power to said snubber circuit to shut off.

6. The voltage transient suppression circuit of claim 1 wherein said sensing logic device includes a first resistive element connected to a first terminal of said first capacitive element and a second resistive element connected to a second terminal of said second capacitive element, said logic device in operable communication with a second terminal of said first capacitive element and a first terminal of said second capacitive element at a node; said logic device configured to receive voltage signals sensed from said first resistive element, said node, and said second resistive element.

7. The voltage transient suppression circuit of claim 3 wherein said sensing logic device includes a first resistive element connected to a first terminal of said third capacitors and a second resistive element connected to a second terminal of said fourth capacitors, said logic device in operable communication with a second terminal of said first and third capacitors and a first terminal of said second and fourth capacitors at a node; said logic device configured to receive voltage signals sensed from said first resistive element, said node, and said second resistive element.

8. The voltage transient suppression circuit of claim 6 wherein said logic device includes;

a logic circuit configured to receive said voltage signals and obtain a first threshold voltage setting and a second threshold setting; said logic circuit processes said voltage signals and said voltage settings and generates an output indicative of a condition of said snubber circuit.

9. The voltage transient suppression circuit of claim 8 wherein said logic device further includes:

a filter circuit configured to receive said output and sample said output at a first sample period and a second sample period and generate a signal at the end of one of said sample periods.

10. The voltage suppression circuit of claim 9 wherein said signal is indicative of a failed capacitive element of said first and second capacitive elements.

11. The voltage suppression circuit of claim 9 wherein said signal is indicative of a failed power semiconductor.

12. The voltage suppression circuit of claim 9 wherein said first sample period is a predetermined sample period and said second sample period is slower than said first sample period to eliminate false triggers due to noise.

13. The voltage transient suppression circuit of claim 1 wherein said resistor may be replaced by at least one of, or include combinations of:

a metal-oxide varistor;

a Zener diode; and an active resistor.

* * * * *